(12) United States Patent
Bonilla et al.

(10) Patent No.: US 8,836,124 B2
(45) Date of Patent: Sep. 16, 2014

(54) FUSE AND INTEGRATED CONDUCTOR

(75) Inventors: Griselda Bonilla, Fishkill, NY (US); Kaushik Chanda, Santa Clara, CA (US); Samuel Sung Shik Choi, Beacon, NY (US); Ronald G. Filippi, Wappingers Fall, NY (US); Stephan Grunow, Poughkeepsie, NY (US); Naftali Eliahu Lustig, Croton on Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/414,742

(22) Filed: Mar. 8, 2012

(65) Prior Publication Data

US 2013/0234284 A1    Sep. 12, 2013

(51) Int. Cl.
*H01L 23/48* (2006.01)
*H01L 23/52* (2006.01)
*H01L 29/40* (2006.01)

(52) U.S. Cl.
USPC ............... 257/751; 257/750; 257/E23.011; 438/627; 438/629

(58) Field of Classification Search
None
See application file for complete search history.

(56) References Cited

U.S. PATENT DOCUMENTS

| 6,844,245 | B2 | 1/2005 | Barth |
| 7,893,520 | B2 | 2/2011 | Yang et al. |
| 7,943,517 | B2 | 5/2011 | Koike et al. |
| 7,956,463 | B2 * | 6/2011 | Yang et al. ............ 257/751 |
| 8,648,465 | B2 * | 2/2014 | Cabral et al. ........... 257/751 |
| 2005/0277298 | A1 * | 12/2005 | Lin et al. ............ 438/687 |
| 2007/0001307 | A1 | 1/2007 | Usui et al. |
| 2008/0157375 | A1 * | 7/2008 | Lee ................... 257/751 |
| 2009/0072404 | A1 * | 3/2009 | Kikuchi et al. ........... 257/753 |
| 2010/0155951 | A1 | 6/2010 | Koike et al. |
| 2011/0180309 | A1 | 7/2011 | Edelstein et al. |
| 2011/0189849 | A1 | 8/2011 | Koike et al. |

OTHER PUBLICATIONS

T. Nogami et al., CVD Co. and its Application to Cu Damascene Internconnections, IEEE Xplore, Jun. 6-9, 2010, pp. 1-3, Burlingame, CA.

* cited by examiner

*Primary Examiner* — Sonya D McCall Shepard
(74) *Attorney, Agent, or Firm* — George R. McGuire; Catherine Ivers; Bond Schoeneck & King, PLLC (57) ABSTRACT

A fuse structure includes within an aperture within a dielectric layer located over a substrate that exposes a conductor contact layer within the substrate a seed layer interposed between the conductor contact layer and another conductor layer. The seed layer includes a doped copper material that includes a dopant immobilized predominantly within the seed layer. The fuse structure may be severed while not severing a conductor interconnect structure also located over the substrate that exposes a second conductor contact layer within a second aperture. In contrast with the fuse structure that includes the doped seed layer having the immobilized dopant, the interconnect structure includes a doped seed layer having a mobile dopant.

13 Claims, 7 Drawing Sheets

FUSE AND INTEGRATED CONDUCTOR

BACKGROUND OF THE INVENTION

1. Field of the Invention

Embodiments relate generally to fuse structures within microelectronic structures. More particularly, embodiments relate to integration of fuse structures with conductor structures within microelectronic structures.

2. Description of the Related Art

Common in the microelectronic fabrication art are fuse structures which are often used for isolating non-functional microelectronic devices or non-functional microelectronic device arrays within integrated circuits.

While such fuse structures are desirable within the integrated circuit fabrication art and often essential within the integrated circuit fabrication art, such fuse structures are nonetheless not entirely without problems. In that regard, such fuse structures are often difficult to design, engineer and fabricate for optimal performance while not compromising performance of adjacent conductor structures which are not intended to be severable.

Thus, desirable are fuse structures and related methods for fabricating fuse structures that provide fuse structures that are readily operational without compromising performance of adjacent conductor structures which are not intended to be severable.

SUMMARY

Embodiments include a fuse structure, a fuse structure integrated with a conductor structure and a method for fabricating the fuse structure. A fuse structure in accordance with the embodiments includes located within an aperture within a dielectric layer that exposes a conductor contact layer within a substrate over which is located the dielectric layer a doped seed layer comprising a copper containing conductor material that includes an immobilized dopant. The immobilized dopant may be chemically immobilized, for example as an oxidized dopant, or alternatively physically immobilized due to grain size considerations within the copper containing conductor material.

By immobilizing the dopant within the dopant immobilized doped seed layer comprising the copper containing conductor material that includes the immobilized dopant, the fuse structure in accordance with the embodiments is susceptible to electrical severance while an adjacent conductor structure that uses a doped seed layer comprising a copper containing conductor material including a dopant that is mobile provides for enhanced electrical stability and no severance of the adjacent conductor structure.

Generally, immobilization of the dopant within the dopant immobilized doped seed layer in accordance with the embodiments is intended as immobilization incident to thermal annealing of a particular fuse structure at a temperature from about 50 to about 400 degrees centigrade for a time period from about 10 seconds to about 180 minutes (i.e., up to about 400 degrees centigrade for a time period of up to about 180 minutes). Immobilization of such a dopant within such a dopant immobilized doped seed layer may be readily discerned by using analytical techniques such as but not limited to secondary ion mass spectroscopy (SIMS), transmission electron microscopy/electron energy loss spectroscopy (TEM/EELS) and/or transmission electron microscopy/energy dispersive x-ray spectroscopy (TEM/EDX).

Generally, the dopant immobilized seed layer within the fuse structure in accordance with the embodiments includes the immobilized dopant at an immobilized dopant concentration from about 0.1 to about 10 atomic percent, more preferably from about 0.1 to about 5 atomic percent, and still more preferably from about 1 to about 5 atomic percent. Generally at least about 80 percent of the immobilized dopant is retained within the dopant immobilized seed layer incident to the foregoing thermal annealing in accordance with the embodiments, more preferably at least about 90 percent and still more preferably at least about 95 percent. Generally, a mobile dopant seed layer within the conductor structure in accordance with the embodiments includes the mobile dopant at a mobile dopant concentration less than about 60 percent of the immobilized dopant within the dopant immobilized seed layer within the fuse structure, more preferably less than about 50 percent of the immobilized dopant within the dopant immobilized seed layer within the fuse structure and still more preferably less than about 30 percent of the immobilized dopant within the dopant immobilized seed layer within the fuse structure. The foregoing percentages for the immobilized dopant and the mobile dopant assume that the dopant immobilized seed layer within the fuse structure and the mobile dopant seed layer within the conductor structure utilize the same doped copper containing seed layer material.

A particular fuse structure in accordance with the embodiments includes a dielectric layer located over a substrate and including an aperture exposing a conductor contact layer located within the substrate. This particular fuse structure in accordance with the embodiments also includes a seed layer located over the conductor contact layer and lining at least in-part the aperture while being electrically connected with the conductor contact layer, the seed layer comprising a doped copper material having an immobilized dopant located predominantly within the seed layer. This particular fuse structure in accordance with the embodiments also includes a conductor interconnect layer located over and electrically connected with the seed layer.

A particular integrated fuse and interconnect structure in accordance with the embodiments includes a dielectric layer located over a substrate and including a first aperture exposing a first conductor contact layer located within the substrate and a second aperture exposing a second conductor contact layer located within the substrate. This particular integrated fuse and interconnect structure in accordance with the embodiments also includes a fuse structure located within the first aperture, the fuse structure comprising: (1) a first seed layer located over the first conductor contact layer and lining at least in-part the first aperture while being electrically connected with the first conductor contact layer, the first seed layer comprising a doped copper material having an immobilized dopant located predominantly within the first seed layer; and (2) a first conductor layer located over and electrically connected with the first seed layer. This particular integrated fuse and interconnect structure in accordance with the embodiments also includes an interconnect structure located within the second aperture, the interconnect structure comprising: (1) a second seed layer located over the second conductor contact layer and lining at least in-part the second aperture while being electrically connected with the second conductor contact layer, the second seed layer having a mobile dopant; and (2) a second conductor interconnect layer located over and electrically connected with the second seed layer.

A particular method for fabricating a fuse structure in accordance with the embodiments includes forming over a substrate a dielectric layer including an aperture that exposes a conductor contact layer within the aperture. This particular method also includes forming within the aperture a seed layer over the conductor contact layer and lining at least in-part the aperture while being electrically connected with the conductor contact layer, the seed layer formed of a doped copper material having an immobilized dopant formed predominantly within the seed layer. This particular method also includes forming a conductor interconnect layer over and electrically connected with the seed layer.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

The embodiments, which include a fuse structure within an integrated circuit structure, a fuse structure integrated with a conductor interconnect structure within the integrated circuit structure and a method for fabricating the fuse structure within the integrated circuit structure, are understood within the context of the detailed description, as set forth below. The detailed description as set forth below is understood within the context of the drawings described above. Since the drawings are intended for illustrative purposes, the drawings are not necessarily drawn to scale.

The embodiments provide a fuse structure that is readily integrated with a conductor interconnect structure within an integrated circuit while providing for ready severance of the fuse structure and while not compromising operation of the conductor interconnect structure within the integrated circuit. The embodiments realize the foregoing objective by including within the fuse structure a doped seed layer comprising a copper containing conductor material that includes an immobilized dopant (i.e., to provide a dopant immobilized doped seed layer) while also including within the adjacent conductor structure a doped seed layer that includes a copper containing conductor material having a dopant that is mobile.

While the embodiments that follow illustrate the invention within the context of fuse structures integrated with conductor interconnect structures within single damascene structures, the embodiments are not intended to be so limited. Rather, embodiments may illustrate the invention within the context of damascene structures including but not limited to single damascene structures and dual damascene structures, as well as non-damascene structures.

FIG. 1A to FIG. 1D show a series of schematic cross-sectional diagrams illustrating the results of progressive process stages in fabricating a fuse structure in accordance with a first embodiment.

Figure 1A:
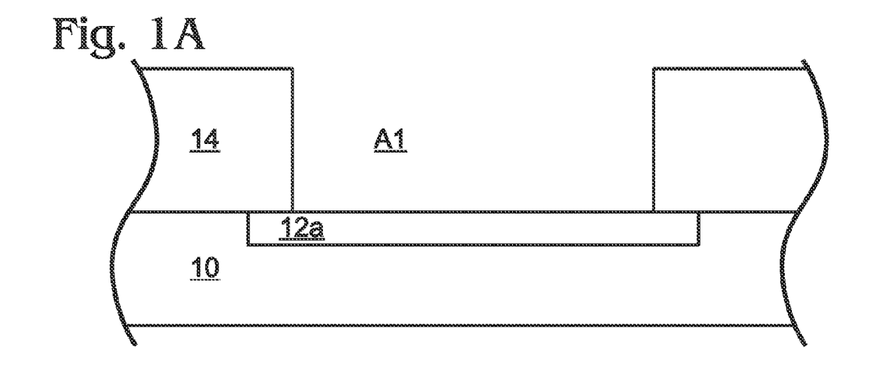
FIG. 1A, FIG. 1B, FIG. 1C and FIG. 1D show a series of schematic cross-sectional diagrams illustrating the results of progressive process stages in fabricating a fuse structure in accordance with a first embodiment.

FIG. 1A shows a substrate 10 having located and formed therein a first conductor contact layer 12a that is exposed at the bottom of a first aperture A1 located and formed through a dielectric layer 14 that is also located and formed upon the substrate 10.

Within this particular first embodiment, the substrate 10, the first conductor contact layer 12a and the dielectric layer 14 may each comprise materials and have dimensions that are otherwise generally conventional in the microelectronic fabrication art, and in particular the semiconductor fabrication art.

For example, the substrate 10 may comprise any combination of conductor materials, semiconductor materials and dielectric materials that is otherwise generally known in the microelectronic fabrication art. Typically, the substrate 10 comprises at least in part a semiconductor substrate having located and formed thereupon and/or thereover a plurality of dielectric layers and a plurality of conductor layers to provide a plurality of dielectric isolated conductor metallization structures located and formed over the semiconductor substrate. Although not specifically illustrated within the schematic cross-sectional diagram of FIG. 1A, when the substrate 10 thus comprises a semiconductor substrate, the substrate 10 (and the semiconductor substrate more particularly) will typically also include therein and/or thereupon microelectronic devices, such as but not limited to semiconductor devices, that are otherwise generally conventional in the microelectronic fabrication art. Such microelectronic devices may include, but are not necessarily limited to, resistors, transistors, capacitors and diodes.

In addition, the first conductor contact layer 12a may also comprise any of several conductor contact materials that are also generally conventional in the microelectronic fabrication art, and in particular the semiconductor fabrication art. Such conductor contact materials may include, but are not necessarily limited to metals, metal alloys and polycide (i.e., doped polysilicon/metal silicide stack) conductor contact materials. Typically and preferably, the first conductor contact layer 12a comprises a copper or copper alloy conductor contact material located and formed embedded within the substrate 10 at the base of the first aperture A1, which in turn typically has a linewidth dimension from about 5 to about 2000 nanometers.

Further, the dielectric layer 14 may comprise any of several dielectric materials that are otherwise also generally conventional in the microelectronic fabrication art, and in particular the semiconductor fabrication art. Such dielectric materials may comprise, but are not necessarily limited to, silicon oxide dielectric materials, silicon nitride dielectric materials and silicon oxynitride dielectric materials, as well as laminates and composites of silicon oxide dielectric materials, silicon nitride dielectric materials and silicon oxynitride dielectric materials. The embodiments also contemplate the use of silicon oxide based dielectric materials that may be further doped with carbon, hydrogen and/or fluorine dopant materials to provide the dielectric layer 14 with a generally low dielectric constant (i.e., less than about 2.2) in comparison with the more generally conventional silicon oxide dielectric materials, silicon nitride dielectric materials and silicon oxynitride dielectric materials that have a dielectric constant of at least about 4.0.

Typically and preferably, the dielectric layer 14 comprises at least in part a silicon oxide dielectric material located and formed upon or over the substrate 10 in a fashion such as to expose the first conductor contact layer 12a at the base of the first aperture A1, where the dielectric layer 14 is formed to a thickness from about 50 to about 500 nanometers. More preferably, the dielectric layer 14 also typically includes a low dielectric constant dielectric material as described above. Commonly, the dielectric layer 14 may also include etch stop layers and planarizing stop layers, particularly under circumstances when the embodiments are intended to include dual damascene apertures.

Figure 1B:
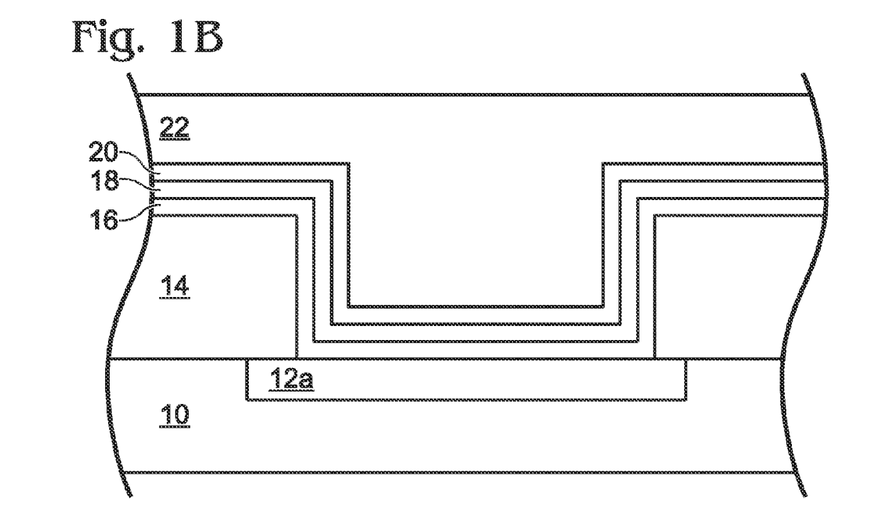

FIG. 1B shows the results of further processing of the microelectronic structure whose schematic cross-sectional diagram is illustrated in FIG. 1A. FIG. 1B shows successively layered upon or over the microelectronic structure of FIG. 1A, and filling the first aperture A1: (1) a first barrier layer 16 located and formed upon the microelectronic structure of FIG. 1A and lining directly the first aperture A1; (2) an oxygen doped metal material layer 18 located and formed upon the barrier layer 16; (3) a doped seed layer 20 located and formed upon the oxygen doped metal material layer 18; and (4) a conductor layer 22 located and formed upon the doped seed layer 20 and completely filling the first aperture A1.

The barrier layer 16 may comprise a barrier material that is otherwise generally conventional in the microelectronic fabrication art, and in particular the semiconductor fabrication art. Such barrier materials may include, but are not necessarily limited to tantalum, tantalum nitride, titanium, titanium nitride, tungsten, tungsten nitride and related refractory metal and refractory metal nitride barrier materials, as well as laminates of the foregoing barrier materials, composites of the foregoing barrier materials and alloys of the foregoing barrier materials. The foregoing barrier materials in the form of the barrier layer 16 may be located and formed upon the microelectronic structure of FIG. 1A to provide in-part the microelectronic structure of FIG. 1B while using methods including but not limited to chemical vapor deposition (CVD) methods and physical vapor deposition (PVD) methods. Typically and preferably, the barrier layer 16 comprises: (1) a tantalum nitride material underlayer (i.e., generally but not necessarily of stoichiometric composition) located and formed upon the microelectronic structure of FIG. 1A and having a thickness about 0.3 to about 40 nanometers; to which is laminated (2) a tantalum metal overlayer having a thickness from about 0.3 to about 40 nanometers. Typically and preferably, each of the tantalum nitride material underlayer and the tantalum metal overlayer is deposited using a physical vapor deposition method.

The oxygen doped metal material layer 18 comprises an oxygen doped metal material which serves as an oxygen diffusion source incident to further processing of the microelectronic structure whose schematic cross-sectional diagram is illustrated in FIG. 1A. Although other oxygen diffusion source materials are not precluded, and as well other oxygen doped metals are also not precluded, this particular embodiment uses a particular organometallic cobalt metal precursor material (i.e., CCTBA (dicobalt-hexacarbonyl-butylacetylene)) within a chemical vapor deposition method for locating and forming the oxygen doped metal material layer 18 upon the barrier layer 16. More particularly, the chemical vapor deposition method also uses generally conventional chemical vapor deposition conditions to provide an oxygen doped cobalt metal layer as generally described in Nogami et al., "CVD Co and its Application to Cu Damascene Interconnections," 2010 IEEE International Interconnection Conference (IITC 2010).

Typically and preferably, the oxygen doped metal material layer 18 when comprising an oxygen doped cobalt metal material in accordance with the above description is characterized by methods including but not limited to x-ray fluorescence (XRF) methods, secondary ion mass spectroscopy methods (SIMS) and Auger electron spectroscopy (AES) methods. Typically, the oxygen doped metal material layer 18 has a thickness from about 0.5 to about 5.0 nanometers.

The doped seed layer 20 comprises a doped seed material, and more particularly a doped copper containing conductor seed material that includes a dopant such as but not limited to aluminum (Al), magnesium (Mg), beryllium (Be), calcium (Ca), strontium (Sr), barium (Ba), scandium (Sc), yttrium (Y), lawrencium (La), cerium (Ce), praseodymium (Pr), neodinium (Nd), samarium (Sm), europium (Eu), gadolinium (Gd), terbium (Tb), dysprosium (Dy), holium (Ho), (erbium (Er), thulium (Tm), ytterbium (Yb), lutetium (Lu), hafnium (Hf), vanadium (V), niobium (Nb), tantalum (Ta), chromium (Cr), molybdenum (Mo), tungsten (W), manganese (Mn), rhenium (Re), silicon (Si) and germanium (Ge) dopant at a total dopant concentration from about 0.1 to about 10 atomic percent, more preferably 0.1 to about 5 atomic percent, and more preferably from about 1 to about 5 atomic percent. Such a doped seed layer 20 may be formed using any of several methods, including but not limited to chemical vapor deposition methods and physical vapor deposition methods, but most commonly such a doped seed layer 20 is formed using a physical vapor deposition method, such as but not limited to a physical vapor deposition sputtering method, in order to assure chemical composition homogeneity and control within the doped seed layer 20. Thus, typically and preferably, the doped seed layer 20 is located and formed upon the oxygen doped metal material layer 18 using a physical vapor deposition sputtering method to provide the doped seed layer 20 most commonly comprising a manganese dopant at a concentration from about 0.1 to about 2.0 atomic percent (or alternative ranges as above), and having a thickness from about 10 to about 200 nanometers.

The conductor layer 22 comprises a conductor material, and more particularly a copper containing conductor material, and still more particularly a pure copper containing conductor material. Although such pure copper containing conductor materials may be formed using methods including but not limited to chemical vapor deposition methods and physical vapor deposition methods, the conductor layer 22 when comprised of a pure copper containing conductor material is typically located and formed upon the doped seed layer 20 while using a plating method. Typically and preferably, such a conductor layer 22 comprising a pure copper containing conductor material is formed to a thickness from about 100 to about 1000 nanometers while using the plating method.

Figure 1C:
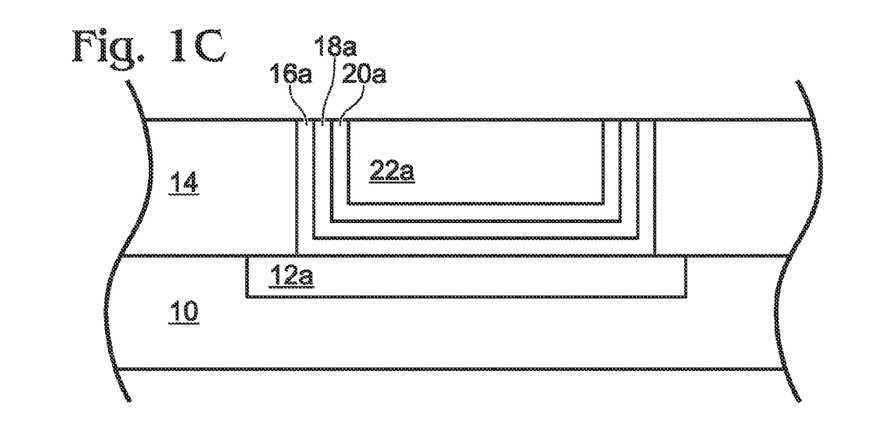

FIG. 1C shows the results of further processing of the microelectronic structure of FIG. 1B.

FIG. 1C shows the results of sequentially planarizing the conductor layer 22, the doped seed layer 20, the oxygen doped metal material layer 18 and the barrier layer 16 that are illustrated in FIG. 1B to provide located and formed within the first aperture A1: (1) a barrier layer 16a lining directly the first aperture A1; (2) an oxygen doped metal material layer 18a located and formed upon the barrier layer 16a; (3) a doped seed layer 20a located and formed upon the oxygen doped metal material layer 18a; and (4) a conductor layer 22a located and formed upon doped seed layer 20a and completely filling the first aperture A1. The foregoing planarizing of the conductor layer 22, the doped seed layer 20, the oxygen doped metal material layer 18 and the barrier layer 16 to provide, sequentially nested, the barrier layer 16a, the oxygen doped metal material layer 18a, the doped seed layer 20a and the conductor layer 22a may be effected using planarizing methods and planarizing materials that are otherwise generally conventional in the microelectronic fabrication art, and in particular the semiconductor fabrication art. Such planarizing methods and planarizing materials may include, but are not limited to, mechanical planarizing methods and materials, chemical planarizing methods and materials, and chemical mechanical polish (CMP) planarizing methods and materials. Chemical mechanical polish planarizing methods and materials that utilize appropriate chemical mechanical polish planarizing slurry materials are most common.

Figure 1D:
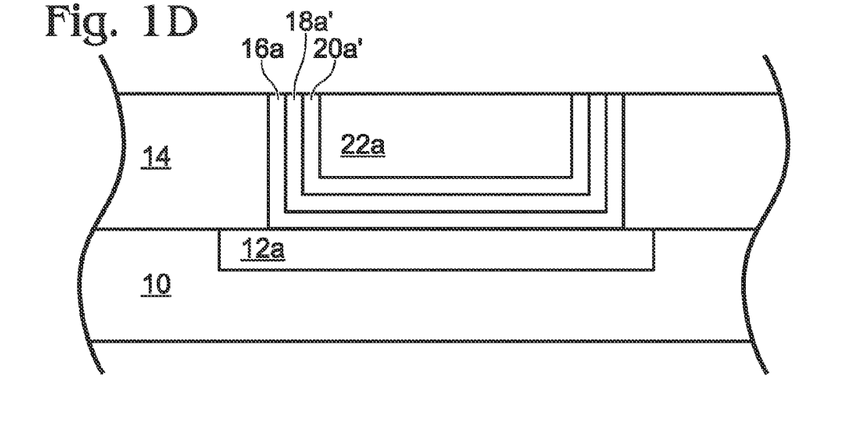

FIG. 1D shows the results of further processing of the microelectronic structure of FIG. 1C.

FIG. 1D shows the results of thermally annealing the microelectronic structure of FIG. 1C to form from the oxygen doped metal material layer 18a and the doped seed layer 20a a corresponding oxygen depleted oxygen doped metal material layer 18a' and a dopant immobilized doped seed layer 20a'. Typically and preferably, such an annealing of the microelectronic structure of FIG. 1C to provide the microelectronic structure of FIG. 1D is undertaken at a temperature from about 50 to about 400 degrees centigrade for a time period from about 10 seconds to about 180 minutes in an inert atmosphere, such as but not limited to a nitrogen atmosphere or an argon atmosphere.

As is understood by a person skilled in the art, it is anticipated within this first embodiment that mobile oxygen within the oxygen doped metal material layer 18a facilely diffuses into the doped seed layer 20a where the facile mobile diffused oxygen reacts with the dopant within the doped seed layer 20a to provide immobilized dopants within the dopant immobilized doped seed layer 20a'. Thus, it is anticipated that the immobilized dopant within the dopant immobilized doped seed layer 20a' is substantially and predominantly (i.e., greater than about 80 atomic percent and more preferably greater than about 90 atomic percent and still more preferably greater than about 95 atomic percent) retained within the dopant immobilized doped seed layer 20a'. Due to this immobilization of the dopant within the dopant immobilized doped seed layer 20a', the composite fuse structure as illustrated within the schematic cross-sectional diagram of FIG. 1D is comparatively more susceptible to being severed relative to a related conductor structure that includes a mobile dopant within a doped seed layer.

FIG. 2A to FIG. 2D show a series of schematic cross-sectional diagrams illustrating the results of progressive process stages in fabricating a fuse structure in accordance with a second embodiment.

Figure 2A:
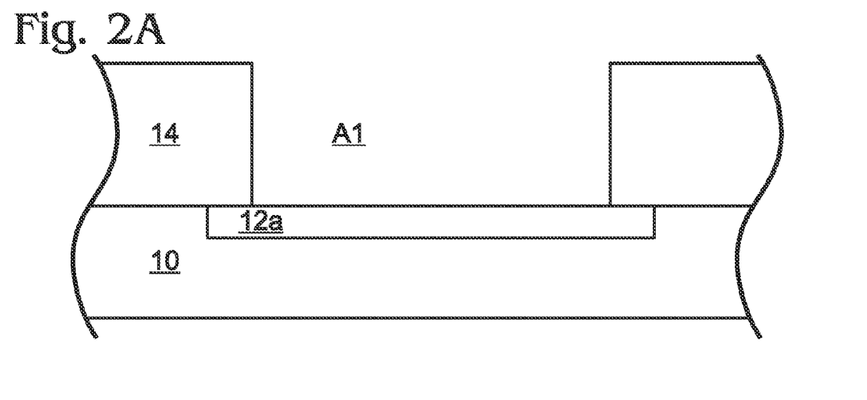
FIG. 2A, FIG. 2B, FIG. 2C and FIG. 2D show a series of schematic cross-sectional diagrams illustrating the results of progressive process stages in fabricating a fuse structure in accordance with a second embodiment.

As is illustrated within the schematic cross-sectional diagram of FIG. 2A, a microelectronic structure in accordance with the second embodiment starts with the same microelectronic structure as the microelectronic structure in accordance with the first embodiment as illustrated within FIG. 1A. To that end, the microelectronic structure in accordance with the second embodiment also includes: (1) the substrate 10 having located and formed embedded within the substrate 10 the first conductor contact layer 12a; as well as (2) the dielectric layer 14 located and formed upon the substrate 10 and including the first aperture A1 at the base of which is exposed the first conductor contact layer 12a.

Figure 2B:
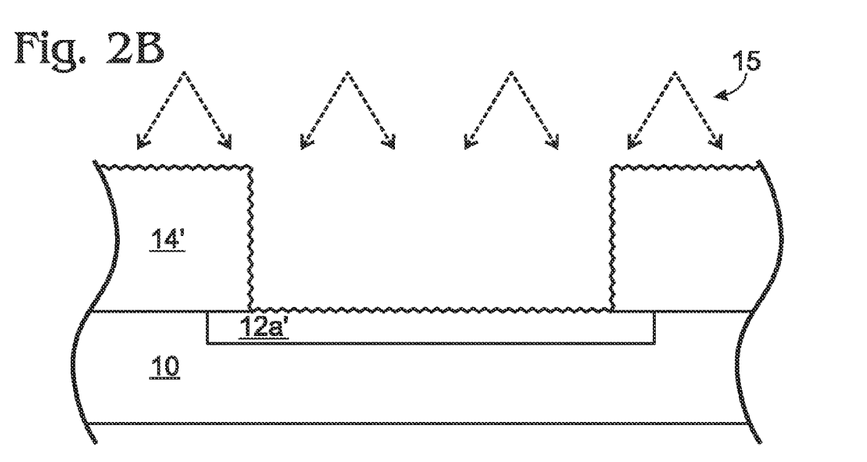

FIG. 2B shows the results of further processing of the microelectronic structure of FIG. 2A.

FIG. 2B in particular shows the results of roughening the surfaces of the dielectric layer 14 and the first conductor contact layer 12a within a sputtering plasma 15 to provide a roughened dielectric layer 14' and a roughened first conductor contact layer 12a'. Typically and preferably, the sputtering plasma 15 for roughening the dielectric layer 14 to provide the roughened dielectric layer 14' and the first conductor contact layer 12a to provide the roughened first conductor contact layer 12a' is an argon ion sputtering plasma method that also uses: (1) a reactor chamber pressure from about 1 to about 100 milli-torr; (2) a bias power from about 300 to about 2000 watts; and (3) an ionization power sufficient to produce an argon ion plasma of density of at least 1e10 positive argon ions per cubic centimeter.

When roughening the surface of the dielectric layer 14 and the first conductor contact layer 12a as is illustrated in FIG. 2A to provide the roughened dielectric layer 14' and roughened first conductor contact layer 12a' that are illustrated in FIG. 2B, it is anticipated that the roughened dielectric layer 14' and the roughened first conductor contact layer 12a' will have a root mean square surface roughness from about 25 to about 500 angstroms. Such roughening of the dielectric layer 14 to provide the roughened dielectric layer 14' and the first conductor contact layer 12a to provide the roughened first conductor contact layer 12a' may be readily characterized and confirmed using scanning electron microscopy methods and transmission electron microscopy methods, as well as other related methods.

Figure 2C:
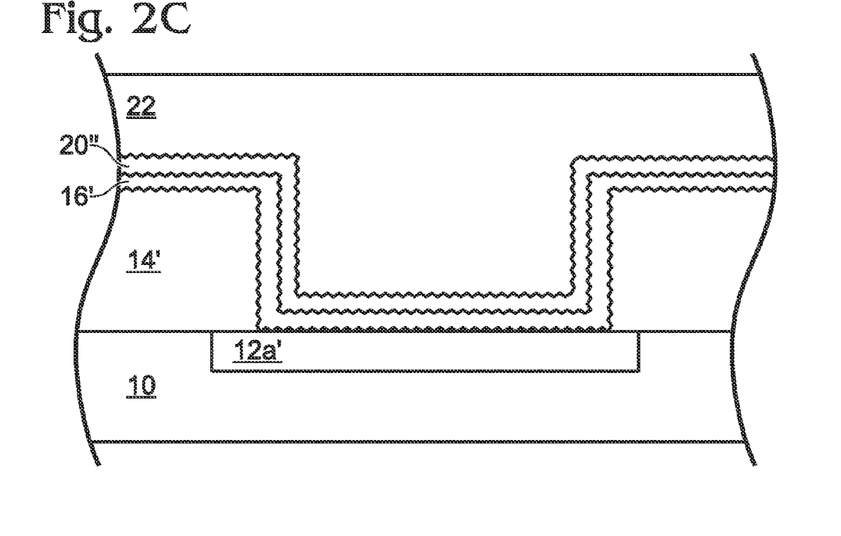

FIG. 2C shows the results of further processing of the microelectronic structure of FIG. 2B.

FIG. 2C shows sequentially layered upon the microelectronic structure whose schematic cross-sectional diagram is illustrated in FIG. 2B a roughened barrier layer 16', a roughened doped seed layer 20" and the conductor layer 22. Within the schematic cross-sectional diagram of FIG. 2C, the roughened barrier layer 16' otherwise correlates with the barrier layer 16 that is illustrated within FIG. 1B, but has replicated therein at least a portion of the surface roughness of the roughened dielectric layer 14'. As well, the roughened doped seed layer 20" that is illustrated within the schematic cross-sectional diagram of FIG. 2C otherwise also correlates with the doped seed layer 20 that is also illustrated within the schematic cross-sectional diagram of FIG. 1B, but it also has replicated therein at least a portion of the surface roughness from the roughened barrier layer 16'. The conductor layer 22 may be formed of a sufficient thickness that it does not replicate a surface roughness of the roughened doped seed layer 20" at its upper surface. It is anticipated within this second embodiment that the surface roughness of the particular roughened barrier layer 16' and the roughened doped seed layer 20" will provide for smaller size crystal growth within the roughened doped seed layer 20" that in turn also provides for a physical rather than chemical immobilization of dopants within the roughened doped seed layer 20".

Figure 2D:
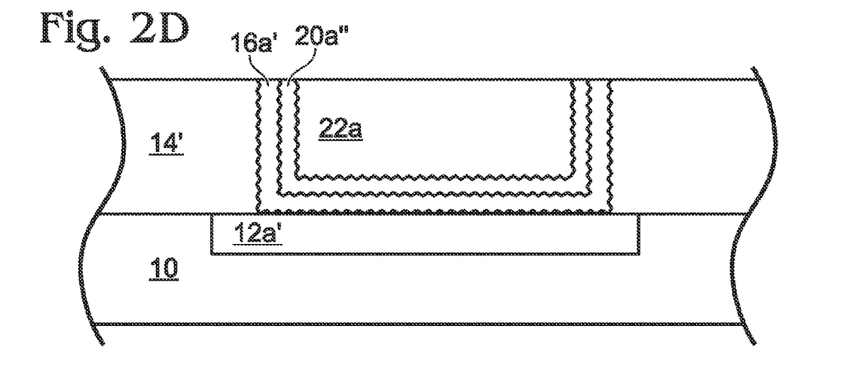

FIG. 2D shows the results of further processing of the microelectronic structure of FIG. 2C.

FIG. 2D shows the results of sequentially planarizing the conductor layer 22, the roughened doped seed layer 20" and the roughened barrier layer 16' to provide: (1) a roughened barrier layer 16a' located and formed lining directly the first aperture A1; (2) a roughened doped seed layer 20a" located and formed upon the roughened barrier layer 16a'; and (3) the conductor layer 22a located and formed upon the roughened doped seed layer 20a". The planarizing of the conductor layer 22, the roughened doped seed layer 20" and the roughened barrier layer 16" that are illustrated in FIG. 2C to provide the microelectronic structure whose schematic cross-sectional diagram is illustrated in FIG. 2D may be effected using planarizing methods and planarizing materials that are otherwise generally analogous, equivalent or identical with the planarizing methods and planarizing materials that are used for planarizing the microelectronic structure of FIG. 1B to provide the microelectronic structure of FIG. 1C.

As is indicated above, and similarly with the first embodiment, the second embodiment also provides for immobilized dopants within the dopant immobilized roughened doped seed layer 20a", however the immobilized dopants are immobilized incident to a crystalline structure and crystal structure size within the dopant immobilized roughened doped seed layer 20a" rather than a chemical immobilization of a particular dopant, such as but not limited to a manganese dopant, incident to an oxidation reaction.

FIG. 3A to FIG. 3E show a series of schematic cross-sectional diagrams illustrating the results of progressive process stages in fabricating a fuse structure within a microelectronic structure in accordance with a third embodiment.

Figure 3A:
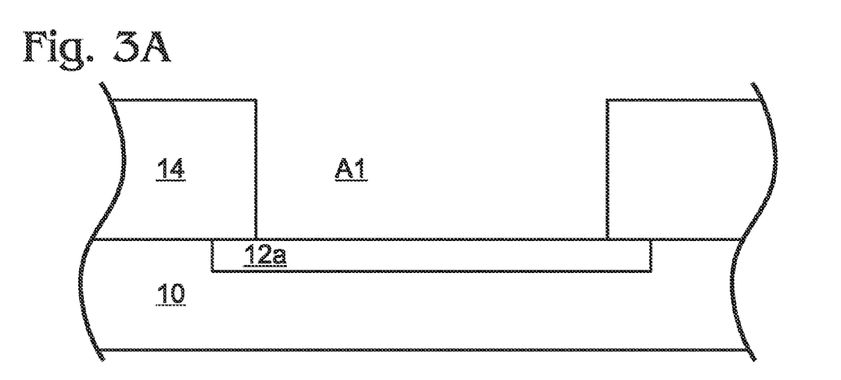
FIG. 3A, FIG. 3B, FIG. 3C, FIG. 3D and FIG. 3E show a series of schematic cross-sectional diagrams illustrating the results of progressive process stages in fabricating a fuse structure in accordance with a third embodiment.

Similarly with the first embodiment and the second embodiment, the third embodiment also starts with the same basic microelectronic structure as is now illustrated within either FIG. 1A, FIG. 2A or FIG. 3A. This particular microelectronic structure comprises the substrate 10 having located and formed therein the first conductor contact layer 12a. The particular microelectronic structure also includes the dielectric layer 14 located and formed upon the substrate 10 and including the first aperture A1 that exposes the first conductor contact layer 12a.

Figure 3B:
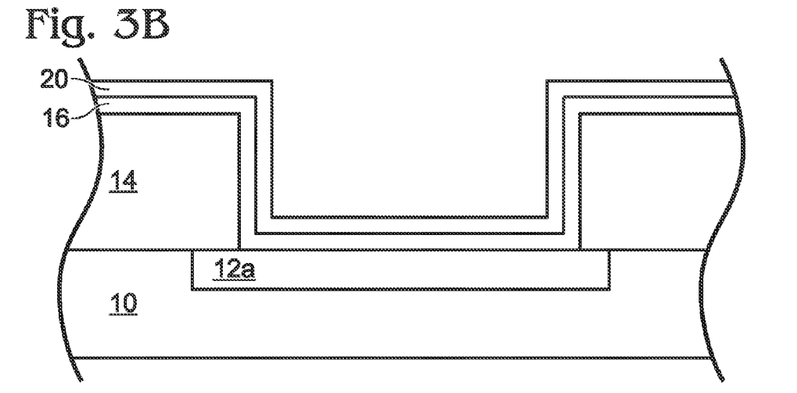

FIG. 3B shows the results of further processing of the microelectronic structure of FIG. 3A.

FIG. 3B shows the results of sequentially lining, locating and forming the barrier layer 16 and then the doped seed layer 20 into the first aperture A1 while not completely filling the first aperture A1. Thus, FIG. 3B correlates generally with FIG. 1B, but with an absence of the oxygen doped metal material layer 18 and the conductor layer 22.

Figure 3C:
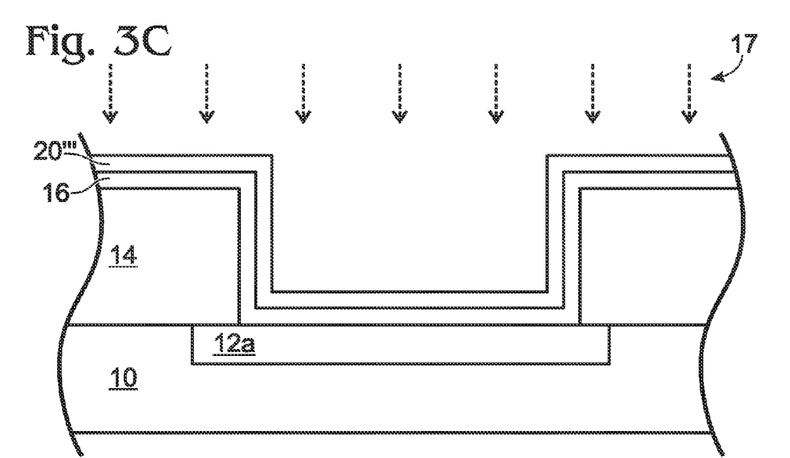

FIG. 3C shows the results of further processing of the microelectronic structure of FIG. 3B.

FIG. 3C shows the results of ion implanting the doped seed layer 20 as illustrated in FIG. 3B with a dopant immobilizing ion 17 to provide a dopant immobilized doped seed layer 20'''. Within this third embodiment, the dopant immobilizing ion 17 preferably comprises an oxygen ion or an oxygen ion containing species, and thus the embodiment is not necessarily limited to purely an oxygen immobilizing ion. Within the context of oxygen dopant immobilizing ions, the third embodiment contemplates an oxygen ion implantation method that uses: (1) a dose from about 1e14 to about 1e17 oxygen dopant immobilizing atoms per square centimeter; and (2) an ion implantation energy from about 1 to about 10 keV, at a substrate 10 (and overlying layers) temperature from about 20 to about 300 degrees centigrade.

As is understood by a person skilled in the art, this particular third embodiment provides, similarly with the first embodiment, for immobilization of a dopant with a doped seed layer on the basis of forming an immobilizing and stable oxide with the dopant.

Figure 3D:
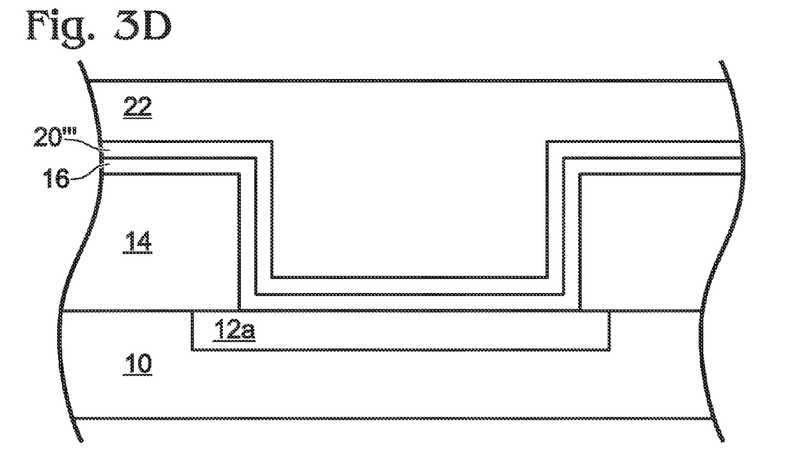

FIG. 3D shows the results of further processing of the microelectronic structure of FIG. 3C.

FIG. 3D shows the conductor layer 22 located and formed upon the dopant immobilized doped seed layer 20''' after the oxygen ion implantation treatment. The conductor layer 22 is described more fully within the context of FIG. 1B.

Figure 3E:
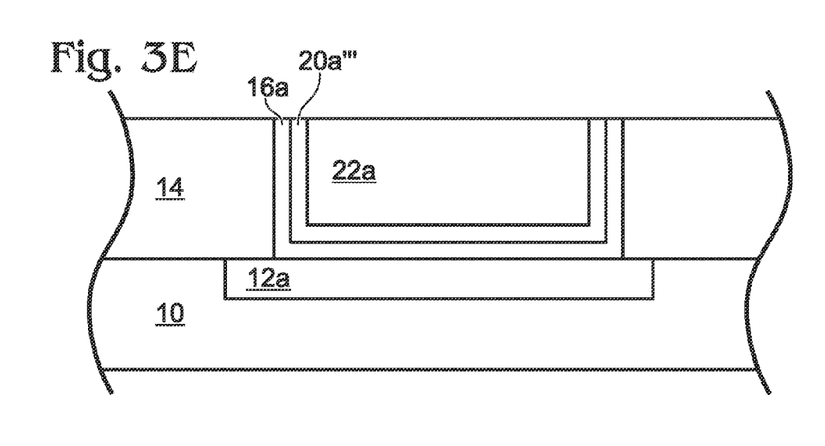

FIG. 3E shows the results of further processing of the microelectronic structure of FIG. 3D.

FIG. 3E shows the results of sequentially planarizing the conductor layer 22, the dopant immobilized doped seed layer 20''' and the barrier layer 16 to provide completely filling the first aperture A1: (1) a barrier layer 16a lining directly the first aperture A1; (2) a dopant immobilized doped seed layer 20a' located and formed upon the barrier layer 16a; and (3) the conductor layer 22a located and formed upon the dopant immobilized doped seed layer 20a'''.

Within the context of any of the three foregoing embodiments, a dopant initially mobile within a doped seed layer is immobilized within a dopant immobilized doped seed layer that otherwise comprises a copper containing conductor material. Immobilization of such a dopant within such a dopant immobilized doped seed layer may be readily discerned by using secondary ion mass spectroscopy, transmission electron microscopy/electron energy loss spectroscopy and/or transmission electron microscopy/energy dispersive x-ray spectroscopy methods for measuring the immobilized dopant concentration and/or chemical state incident to further annealing of a particular fuse structure in accordance with the foregoing embodiments at a temperature from about 50 to about 400 degrees centigrade for a time period from about 10 seconds to about 180 minutes.

FIG. 4A to FIG. 4D show a series of schematic cross-sectional diagrams illustrating the results of progressive stages in fabricating and integrating within a microelectronic structure the fuse structure in accordance with the first embodiment as illustrated in FIG. 1D, in conjunction with an interconnect structure. The embodiments also contemplate that the fuse structure in accordance with the second embodiment or the third embodiment may alternatively be integrated with the interconnect structure as further illustrated below.

Figure 4A:
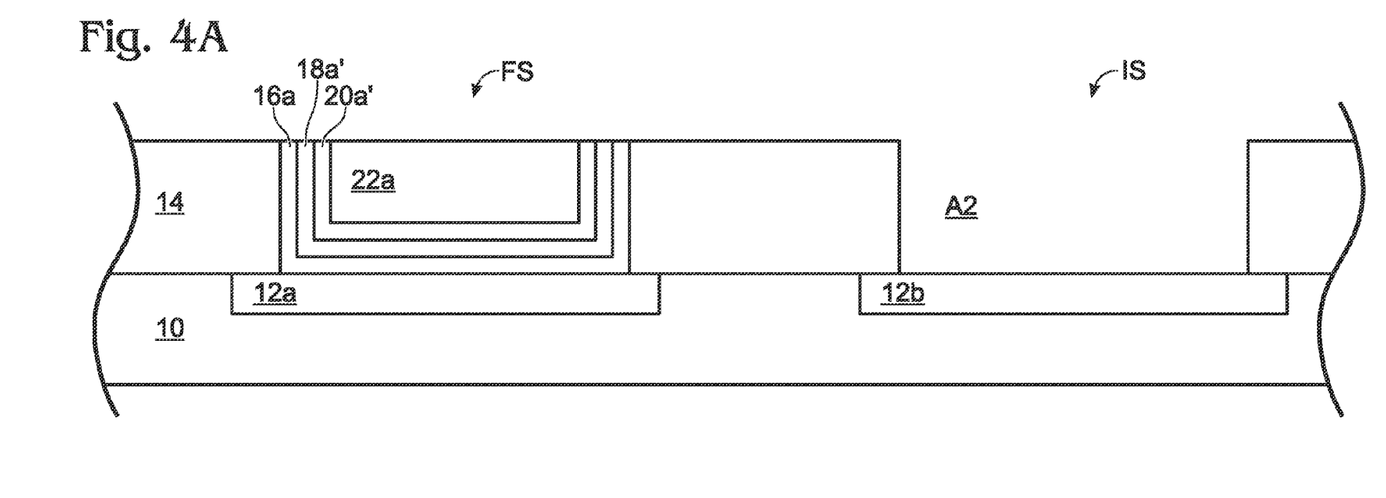
FIG. 4A, FIG. 4B, FIG. 4C and FIG. 4D show a series of schematic cross-sectional diagrams illustrating the results of progressive process stages in integrating a fuse structure in accordance with the first embodiment with a conductor interconnect structure.

FIG. 4A shows at the left hand side the fuse structure FS of FIG. 1D that includes the substrate 10 having located and formed therein the first conductor contact layer 12a, where the dielectric layer 14 is located and formed over the substrate 10 and exposing the first conductor contact layer 12a at the base of the first aperture A1. Consistent with FIG. 1D, located and formed sequentially filling the first aperture A1 is: (1) the barrier layer 16a lining directly the first aperture A1; (2) the oxygen depleted oxygen doped metal material layer 18a'; (3) the dopant immobilized doped seed layer 20a'; and (4) the conductor layer 22a.

Also shown in FIG. 4A at the right hand side is an interconnect structure IS comprising a second conductor contact layer 12b located and formed within the contiguous substrate 10, where the contiguous dielectric layer 14 that is located and formed upon the substrate 10 also includes a second aperture A2 which exposes the second conductor contact layer 12b. Within the microelectronic structure whose schematic cross-sectional diagram is illustrated in FIG. 4A, the first conductor contact layer 12a and the second conductor contact layer 12b are otherwise analogous, equivalent or identical in materials and composition. In addition, the second aperture A2 is generally, but not exclusively, dimensioned analogously with the first aperture A1 as illustrated in FIG. 1A.

Figure 4B:
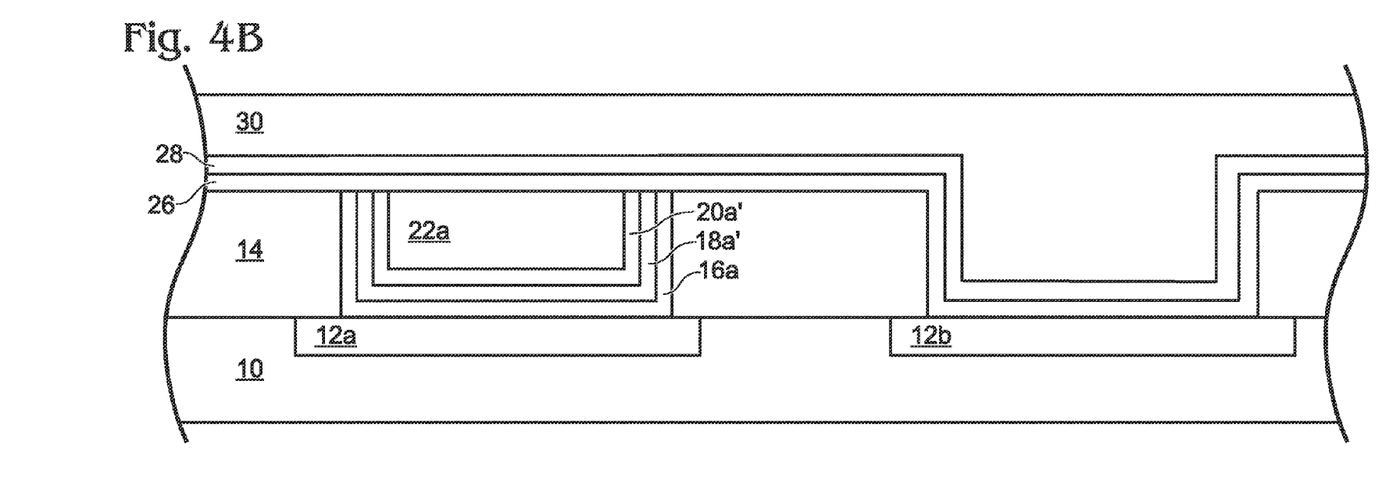

FIG. 4B shows the results of further processing of the microelectronic structure of FIG. 4A.

FIG. 4B shows successively layered upon the microelectronic structure of FIG. 4A while completely filling the second aperture A2: (1) a second barrier layer 26 located and formed directly lining the second aperture A2; (2) a second doped seed layer 28 located and formed upon the second barrier layer 26; and (3) a second conductor layer 30 located and formed upon the second doped seed layer 28. Within this particular fuse structure FS and integrated interconnect structure IS embodiment, the second barrier layer 26 may comprise materials and have dimensions analogous, identical or equivalent to the materials and dimensions used for fabricating the first barrier layer 16 that is illustrated in FIG. 1B. Similarly, within this particular embodiment the second doped seed layer 28 may comprise materials and have dimensions analogous, equivalent or identical to the materials and dimensions used for first doped seed layer 20 that is illustrated in FIG. 1B. Finally, within this particular embodiment, the second conductor layer 30 may comprise materials and have dimensions analogous, equivalent or identical to the materials and dimensions used for fabricating the first conductor layer 22 that is illustrated in FIG. 1B.

While FIG. 4B shows the second barrier layer 26, the second doped seed layer 28 and the second conductor layer 30 located and formed directly upon the integrated circuit structure of FIG. 4A, also contemplated is the use of block-out masking schemes that may mask the fuse structure FS as illustrated in FIG. 4A prior to locating and forming the second barrier layer, 26, the second doped seed layer 28 and the second conductor layer 30 upon the integrated circuit structure of FIG. 4A.

Within the microelectronic structure of FIG. 4B: (1) the second barrier layer 26 also comprises a tantalum nitride material underlayer and tantalum metal overlayer laminated barrier layer; (2) the second doped seed layer 28 also comprises a manganese doped copper containing conductor material having a manganese dopant concentration from about 0.1 to about 2 atomic percent (or alternative preferred ranges as described above); and (3) the second conductor layer 30 comprises a pure copper conductor material formed using an electroplating method.

Figure 4C:
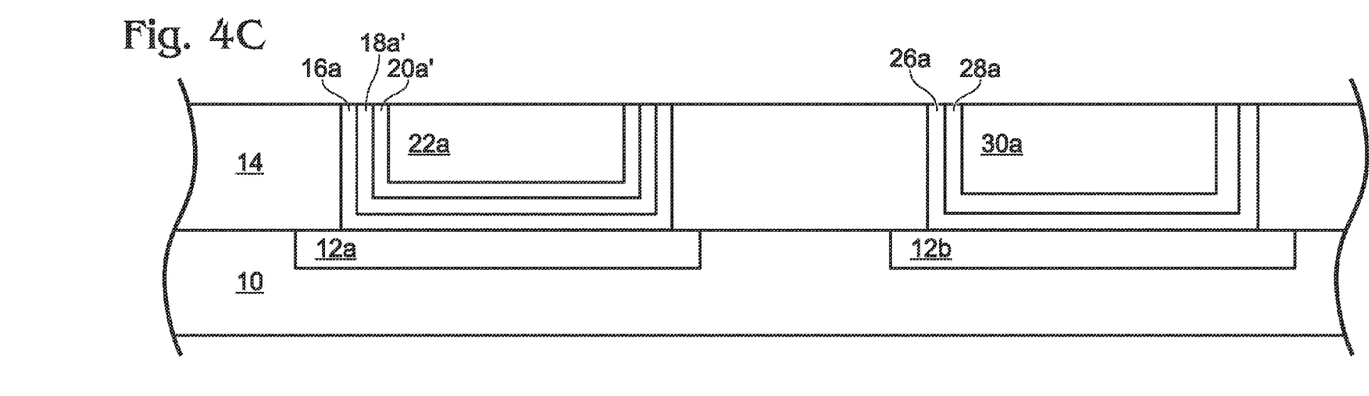

FIG. 4C shows the results of further processing of the microelectronic structure of FIG. 4B.

FIG. 4C shows the results of sequentially planarizing: (1) the second conductor layer 30; (2) the second doped seed layer 28; and (3) the second barrier layer 26 as illustrated in FIG. 4B to form: (1) a second barrier layer 26a lining directly the second aperture A2; (2) a second doped seed layer 28a located and formed upon the second barrier layer 26a; and (3) a second conductor layer 30a located and formed upon the second doped seed layer 28a and completely filling the second aperture A2. The planarizing processing that may be used to form the microelectronic structure of FIG. 4C from the microelectronic structure of FIG. 4B is otherwise analogous, equivalent or identical to the planarizing processing that may be used to form the microelectronic structure of FIG. 1C from the microelectronic structure of FIG. 1B.

Figure 4D:
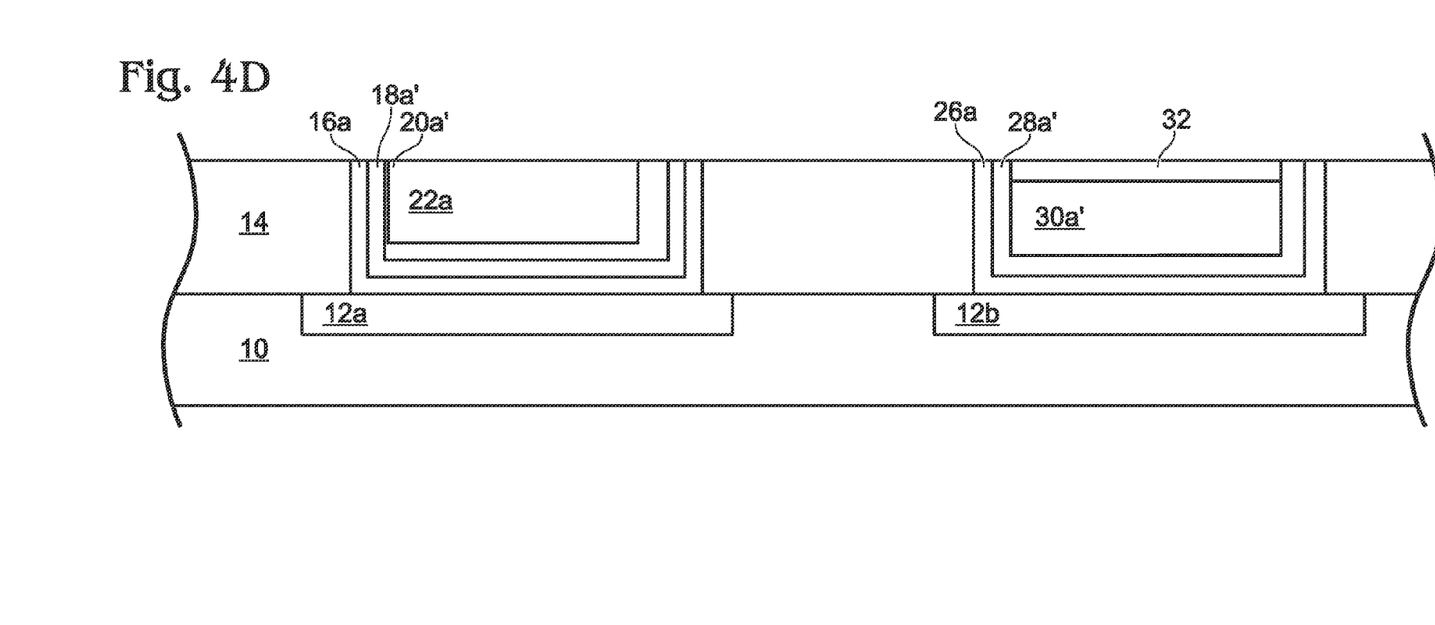

FIG. 4D shows the results of further processing of the microelectronic structure of FIG. 4C.

FIG. 4D shows the results of thermally annealing the microelectronic structure of FIG. 4C at a temperature from about 50 to about 400 degrees centigrade for a time period from about 10 seconds to about 180 minutes, typically in a gas environment, such as but not limited to a nitrogen inert gas environment or an argon inert gas environment that also comprises an oxidant, such as but not limited to oxygen at a concentration from about 10 to about 1000 ppm (i.e., atomic percent). As is illustrated in FIG. 4D, given that the second seed layer 28a is not a dopant immobilized seed layer, the dopants from the second seed layer 28a diffuse through the conductor layer 30a to form a capping layer 32 (i.e., typically comprising a manganese oxide capping material) located and formed upon a conductor layer 30a' in turn located and formed upon a dopant depleted doped seed layer 28a'. Similarly, since the dopant has diffused to the surface of the conductor layer 30a' when forming the capping layer 32, the interconnect structure IS at the right hand side of the schematic cross-sectional diagram of FIG. 4D is able to maintain electrical integrity while the fuse structure at the left hand side of FIG. 4D is subject to comparatively more ready severance.

Thus, the integrated circuit structure in accordance with FIG. 4D provides an integrated circuit which includes: (1) a fuse structure FS that is more susceptible to severance due to the presence of a dopant immobilized doped seed layer 20a'; and an interconnect structure IS that is less susceptible to severance due to the presence of a mobile dopant within a doped seed layer 28a'.

All references, including publications, patent applications and patents cited herein are hereby incorporated by reference in their entireties to the same extent as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The embodiments are thus illustrative of the invention rather than limiting of the invention. Revisions and modifications may be made to methods, materials, structures and dimensions of a fuse structure, an integrated structure including the fuse structure and an interconnect structure, and a related method in accordance with the embodiments while still providing a fuse structure, an integrated fuse structure and an interconnect structure, and a related method in accordance with the embodiments, further in accordance with the accompanying claims.

What is claimed is:

1. A fuse structure comprising:
   a dielectric layer located over a substrate and including an aperture exposing a conductor contact layer located within the substrate;
   a seed layer located over the conductor contact layer and lining at least in-part the aperture while being electrically connected with the conductor contact layer, the seed layer comprising a doped copper material having an immobilized dopant located predominantly within the seed layer;
a barrier layer interposed between the dielectric layer and the seed layer;
an oxygen doped cobalt metal layer interposed between the barrier layer and the seed layer; and
a conductor layer located over and electrically connected with the seed layer.

2. The fuse structure of claim 1 where an interface between the dielectric layer and the barrier layer has a surface roughness from about 25 to about 500 angstroms.

3. The fuse structure of claim 1 wherein a dopant within the doped copper material is selected from the group consisting of Al, Mg, Be, Ca, Sr, Ba, Sc, Y, La, Ce, Pr, Nd, Sm, Eu, Gd, Tb, Dy, Ho, Er, Tm, Yb, Lu, Hf, V, Nb, Ta, Cr, Mo, W, Mn, Re, Si and Ge dopants.

4. The fuse structure of claim 3 wherein the immobilized dopant is immobilized at an annealing temperature from about 50 to about 400 degrees centigrade for a time period from about 10 seconds to about 180 minutes.

5. The fuse structure of claim 4 wherein the dopant is immobilized as an oxide.

6. An integrated fuse structure and conductor interconnect structure comprising:
a dielectric layer located over a substrate and including a first aperture exposing a first conductor contact layer located within the substrate and a second aperture exposing a second conductor contact layer located within the substrate;
a fuse structure located within the first aperture, the fuse structure comprising:
a first seed layer located over the first conductor contact layer and lining at least in-part the first aperture while being electrically connected with the first conductor contact layer, the first seed layer comprising a doped copper material having an immobilized dopant located predominantly within the first seed layer; and
a first conductor layer located over and electrically connected with the first seed layer;
a first barrier layer interposed between the dielectric layer and the first seed layer;
an oxygen doped cobalt metal layer interposed between the first barrier layer and the first seed layer; and
an interconnect structure located within the second aperture, the interconnect structure comprising:
a second seed layer located over the second conductor contact layer and lining at least in-part the second aperture while being electrically connected with the second conductor contact layer, the second seed layer comprising a doped copper material having a mobile dopant; and
a second conductor layer located over and electrically connected with the second seed layer.

7. The integrated structure of claim 6 where an interface between the dielectric layer and the first barrier layer has a surface roughness from about 25 to about 500 angstroms.

8. The integrated structure of claim 6 wherein a dopant within the doped copper material is selected from the group consisting of Al, Mg, Be, Ca, Sr, Ba, Sc, Y, La, Ce, Pr, Nd, Sm, Eu, Gd, Tb, Dy, Ho, Er, Tm, Yb, Lu, Hf, V, Nb, Ta, Cr, Mo, W, Mn, Re, Si and or Ge dopants.

9. The integrated structure of claim 8 wherein
a first dopant concentration is from about 0.1 to about 10 atomic percent within the first seed layer; and
a second dopant concentration is less than about 60 percent of the first dopant concentration within the second seed layer.

10. The integrated structure of claim 8 wherein the dopant is immobilized as an oxide.

11. A method for forming a fuse structure comprising:
forming over a substrate a dielectric layer including an aperture that exposes a conductor contact layer within the aperture;
forming within the aperture a seed layer over the conductor contact layer and lining at least in-part the aperture while being electrically connected with the conductor contact layer, the seed layer formed of a doped copper material having an immobilized dopant formed predominantly within the seed layer, wherein the forming the seed layer uses an oxygen diffusion into the doped copper material;
forming within the aperture a barrier layer prior to forming within the aperture the seed layer; and
forming a conductor layer over and electrically connected with the seed layer.

12. The method of claim 11 wherein the forming the seed layer uses an oxygen ion implantation into the doped copper material.

13. The method of claim 11 wherein the forming the seed layer uses a surface roughening of the dielectric layer prior to forming the barrier layer.

* * * * *